(12) United States Patent
Na et al.

(10) Patent No.: US 11,729,896 B2
(45) Date of Patent: Aug. 15, 2023

(54) APPARATUS FOR GENERATING EXTREME ULTRAVIOLET (EUV), METHOD OF MANUFACTURING THE SAME, AND EUV SYSTEM

(71) Applicant: SAMSUNG ELECTRONICS CO., LTD., Suwon-si (KR)

(72) Inventors: Jihoon Na, Bucheon-si (KR); Mun Ja Kim, Hwaseong-si (KR); Jaewhan Sung, Suwon-si (KR); Byungchul Yoo, Yongin-si (KR); Jibeom Yoo, Hwaseong-si (KR); Hakseok Lee, Hwaseong-si (KR); Myeongjin Jeong, Hwaseong-si (KR); Hyunjune Cho, Suwon-si (KR)

(73) Assignees: SAMSUNG ELECTRONICS CO., LTD., Suwon-si (KR); RESEARCH BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 151 days.

(21) Appl. No.: 17/468,644

(22) Filed: Sep. 7, 2021

(65) Prior Publication Data
US 2022/0167492 A1    May 26, 2022

(30) Foreign Application Priority Data
Nov. 26, 2020   (KR) .................. 10-2020-0161243

(51) Int. Cl.
*H05G 2/00*   (2006.01)
*G03F 7/20*   (2006.01)
(Continued)

(52) U.S. Cl.
CPC .......... *H05G 2/008* (2013.01); *G02B 5/0891* (2013.01); *G02B 5/208* (2013.01);
(Continued)

(58) Field of Classification Search
CPC .......... H05G 2/008; H05G 2/003; H05G 2/00; G02B 5/0891; G02B 5/208;
(Continued)

(56) References Cited

U.S. PATENT DOCUMENTS 6,449,086 B1   9/2002   Singh
6,453,006 B1   9/2002   Kaiser
(Continued)

FOREIGN PATENT DOCUMENTS

KR   10-2010-0130422   12/2010

*Primary Examiner* — Kiet T Nguyen
(74) *Attorney, Agent, or Firm* — F. Chau & Associates, LLC

(57) ABSTRACT

An apparatus for generating extreme ultraviolet (EUV) light includes a raw material supply unit supplying a plasma source for generating EUV light. An EUV light source unit uses a laser to generate plasma from the plasma source. A filter is configured to extract EUV light from the light. A first protective layer is disposed on a front surface of the filter. A frame having a first region exposing at least a portion of the filter or the first protective layer is disposed on the first protective layer. A width of the first region is smaller than a width of the first protective layer and smaller than or equal to a width of the filter.

20 Claims, 14 Drawing Sheets

(51) Int. Cl.
*G02B 5/20* (2006.01)
*G02B 5/08* (2006.01)
*G03F 7/00* (2006.01)

(52) U.S. Cl.
CPC ...... *G03F 7/70033* (2013.01); *G03F 7/70191* (2013.01); *G03F 7/70308* (2013.01); *G03F 7/70958* (2013.01)

(58) Field of Classification Search
CPC ............ G03F 7/70033; G03F 7/70958; G03F 7/70575; G03F 7/70191; G03F 7/70308; G03F 1/22; G21K 1/10
USPC ..................................................... 250/504 R
See application file for complete search history.

(56) References Cited

U.S. PATENT DOCUMENTS

| | | | |
|---|---|---|---|
| 7,821,714 | B1 | 10/2010 | Lee et al. |
| 8,890,099 | B2 | 11/2014 | Hultermans et al. |
| 9,229,331 | B2 | 1/2016 | Von Blanckenhagen et al. |
| 10,185,234 | B2 | 1/2019 | Ershov et al. |
| 2003/0058529 | A1* | 3/2003 | Goldstein ............ G03F 7/70575 359/361 |
| 2006/0160031 | A1* | 7/2006 | Wurm ...................... G21K 1/10 430/394 |
| 2017/0031142 | A1 | 2/2017 | Kim et al. |
| 2019/0011615 | A1 | 1/2019 | Heelweg et al. |

\* cited by examiner

APPARATUS FOR GENERATING EXTREME ULTRAVIOLET (EUV), METHOD OF MANUFACTURING THE SAME, AND EUV SYSTEM

CROSS-REFERENCE TO RELATED APPLICATION(S)

This application claims benefit of and priority to Korean Patent Application No. 10-2020-0161243, filed on Nov. 26, 2020 in the Korean Intellectual Property Office, the disclosure of which is herein incorporated by reference in its entirety.

TECHNICAL FIELD

The present disclosure relates to ultraviolet light generation and, more specifically, to an apparatus for generating extreme ultraviolet (EUV), a method of manufacturing the same, and an EUV system.

DISCUSSION OF THE RELATED ART

Semiconductor devices are being developed to have higher density and smaller sizes. To fabricate such semiconductor devices, technology is needed to form circuit patterns with ever smaller feature sizes. To meet such a technical demand, a wavelength of a light source used in a photolithography process has been reduced. Recently, an extreme ultraviolet (EUV) light exposure process and an inspection process using EUV having a wavelength of 13.5 nm have been proposed.

SUMMARY

An apparatus for generating extreme ultraviolet light includes a raw material supply unit configured to supply a plasma source for generating extreme ultraviolet (EUV) light. An extreme ultraviolet light source unit is configured to start a laser generating plasma from the plasma source. A filter having a front surface, on which light generated from the plasma is incident, and a rear surface is configured to extract extreme ultraviolet light from the light. A first protective layer is disposed on the front surface of the filter. A frame having a first region exposing at least a portion of the filter or the first protective layer is disposed on the first protective layer. In a direction parallel to the front surface of the filter, a width of the first region is smaller than a width of the first protective layer and smaller than or equal to a width of the filter.

An extreme ultraviolet (EUV) light system includes a filter unit including a filter having a front surface, on which light is incident, and a rear surface, opposite to the front surface is configured to extract EUV light from the light. A polymer layer and a frame exposing at least a portion of the protective layer are staked sequentially on the protective layer. The filter unit is disposed on a path along which the light travels. A mirror unit including at least one mirror reflects the EUV light toward a photomask.

An extreme ultraviolet (EUV) light system includes an EUV light source system configured to generate EUV light. A luminance system is configured to expose a surface of a photomask with the EUV light. A projection system is configured to direct EUV light, reflected by the photomask, to a surface of a semiconductor wafer. The EUV light source system includes a filter unit including a filter configured to extract the EUV light from a light source, a protective layer disposed on a front surface of the filter, and a frame disposed on the protective layer and exposing at least a portion of the filter or the protective layer. The filter includes a metallic material, and the protective layer includes graphite or graphene. A metal oxide layer is not present between the filter and the protective layer.

A method of manufacturing an apparatus for generating extreme ultraviolet light includes preparing a first protective layer. A polymer layer is attached to the first protective layer. A frame, having an exposure region exposing at least a portion of the first protective layer or the polymer layer, is attached to the first protective layer or the polymer layer. A filter is deposited on a surface of the first protective layer.

BRIEF DESCRIPTION OF DRAWINGS

The above and other aspects and features of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
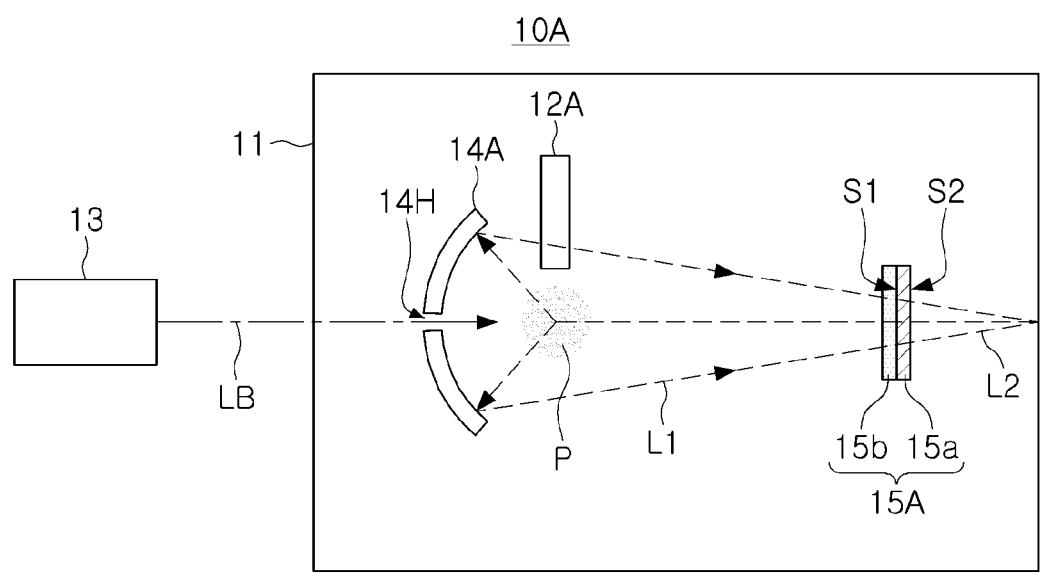
FIG. 1 is a schematic diagram illustrating an apparatus for generating extreme ultraviolet light according to an example embodiment of the present disclosure.

FIG. 1 is a schematic diagram illustrating an apparatus 10A for generating extreme ultraviolet (EUV) light according to an example embodiment of the present disclosure.

Referring to FIG. 1, the apparatus 10A for generating extreme EUV light may include a chamber 11, a raw material supply unit 12A, an EUV light source unit 13, a condensing unit 14A, and a filter unit 15A. The chamber 11 may provide a space in which extreme ultraviolet light is generated. The inside of the chamber 11 may be in a vacuum state such that the generated extreme ultraviolet light is not absorbed in an atmosphere. The chamber 11 may be a vacuum chamber including a vacuum pump and/or a vacuum gauge. Since extreme ultraviolet light L2 is generated from high-temperature plasma P, the inside of the chamber 11 may include (e.g., may be constructed with or otherwise coated with) a material which is not damaged by the high-temperature plasma P.

The raw material supply unit 12 may supply a plasma source for generating extreme ultraviolet light. The raw material supply unit 12A may be provided on one side of the chamber 11. The raw material supply unit 12A may supply a plasma source as a solid target or a droplet target. The plasma source may interact with a laser beam LB to generate plasma P. The plasma source may include one or more of xenon (Xe), lithium (Le), tin (Sn), neon (Ne), argon (Ar), or compounds thereof.

The EUV light source unit 13 may generate the laser beam LB to generate plasma from the plasma source. The EUV light source unit 13 may be disposed outside of the chamber 11. The EUV light source unit 13 may be a laser-produced plasma (LPP) unit generating plasma P with the laser beam LB. The generated plasma P may generate light L1. The light L1 may include light of various wavelengths. The light L1 may include extreme ultraviolet light L2. The laser beam LB may have a high-intensity pulse. The EUV light source unit 13 may include a $CO_2$ laser, an NdYAG laser, a free electron laser (FEL), an ArF excimer laser, a fluoride dimer laser (an F2 dimer), a KrF excimer laser, and the like. In an embodiment of the present disclosure, the FIN light source unit 13 may include a discharge-produced plasma (DPP) unit applying a high voltage to a plasma source to generate plasma P.

The condensing unit 14A may condense the light L1 emitted from the plasma P in all directions. The light L1 may be reflected from one side surface of the condensing unit 14A to be condensed toward the filter unit 15A. The condensing unit 14A may be provided in the form of an antenna having an opening 14H, but the present disclosure is not necessarily limited thereto.

The filter unit 15A includes a filter 15a, having a front surface S1 on which the light L1 is incident and a rear surface S2 opposite to the front surface S1, and a protective layer 15b disposed on the front surface S1. The filter unit 15A may filter the extreme ultraviolet light L2 from the condensed light L1. A wavelength of the extreme ultraviolet light L2 may be within the range of about 4 nm to about 124 nm. As an example, the wavelength of the extreme ultraviolet light L2 may be within the range of about 4 nm to about 20 nm. As an example, the wavelength of the extreme ultraviolet light 12 may be about 13.5 nm.

The filter 15a may include a metallic material, for example, zirconium (Zr). The protective layer 15b may protect the filter 15a from high temperatures and debris produced when the extreme ultraviolet light L2 is generated, and may significantly reduce transmissivity of light having a wavelength other than that of the extreme ultraviolet light L2. An oxide layer might not be present on a boundary surface between the protective layer 15b and the filter 15a.

Accordingly, the protective layer 15b may be in direct contact with the front surface S1 of the filter 15a to prevent loss of the extreme ultraviolet light L2 and to increase extreme ultraviolet light process efficiency. The protective layer 15b may include at least one of a film including graphite or graphene. A thickness of the protective layer 15b may be within the range of about 0.1 nm to about 100 nm to protect the filter 15a and to significantly reduce the loss of the extreme ultraviolet light L2. When the thickness of the protective layer 15b is about 0.1 nm or less, an effect of protecting the filter 15a may be insignificant. When the thickness of the protective layer 15b is about 100 nm or more, the loss of the extreme ultraviolet light L2 may be increased to deteriorate process efficiency. As an example, the thickness of the protective layer 15b may be within the range of about 0.1 nm to about 50 nm. As an example, the thickness of the protective layer 15b may be within the range of about 0.1 nm to about 30 nm. As an example, the protective layer 15b may have emissivity of 0.1 or more, or 0.4 or more.

In extreme ultraviolet light process equipment, rapid oxidation of optical elements in the equipment may occur due to extreme ultraviolet light having high energy and contamination may occur due to debris (for example, hydrocarbon). The optical elements in the extreme ultraviolet light process equipment might have to be replaced within a short period of time, and downtime of the extreme ultraviolet light process equipment may be increased. In an example embodiment of the present disclosure, a protective layer may be introduced to a front surface of a filter for filtering extreme ultraviolet light to extend a filter replacement period and to reduce the downtime of the extreme ultraviolet light equipment. In addition, in an example embodiment of the present disclosure, an oxide layer causing refraction of extreme ultraviolet light is not present between the filter and the protective layer, loss of the extreme ultraviolet light may be significantly reduced and process efficiency may be increased. Accordingly, in an example embodiment of the present disclosure the filter unit 15A may have a filter 15a having a front surface S1, on which the light L1 generated from the plasma P is incident, and a rear surface S2 disposed opposite to the front surface S1, and extracting the extreme ultraviolet light L2 from the light a protective layer 15b disposed on a front surface S1 of the filter 15a, and a frame 15d having an exposure region (15dh of FIG. 2A) exposing at least a portion of the filter 15a or the protective layer 15b, and disposed on the protective layer 15b. In this case, a width 15dW (FIGS. 2A and 4) of the exposure region (15dh of FIGS. 2A and 4) in a direction, parallel to the front surface S1 of the filter 15a, may be smaller than a width 15bW (FIGS. 2A and 4) of the protective layer 15b and smaller than or equal to a width 15aW (FIGS. 2A and 4) of the filter 15a.

Figure 2A:
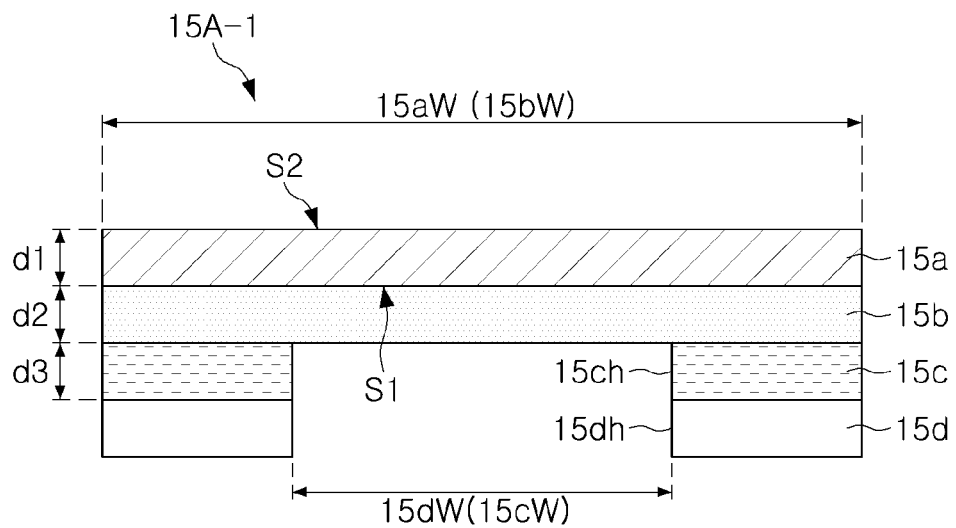
FIG. 2A is a vertical cross-sectional view illustrating an example of a filter unit in the apparatus for generating extreme ultraviolet light of FIG. 1.
Figure 2B:
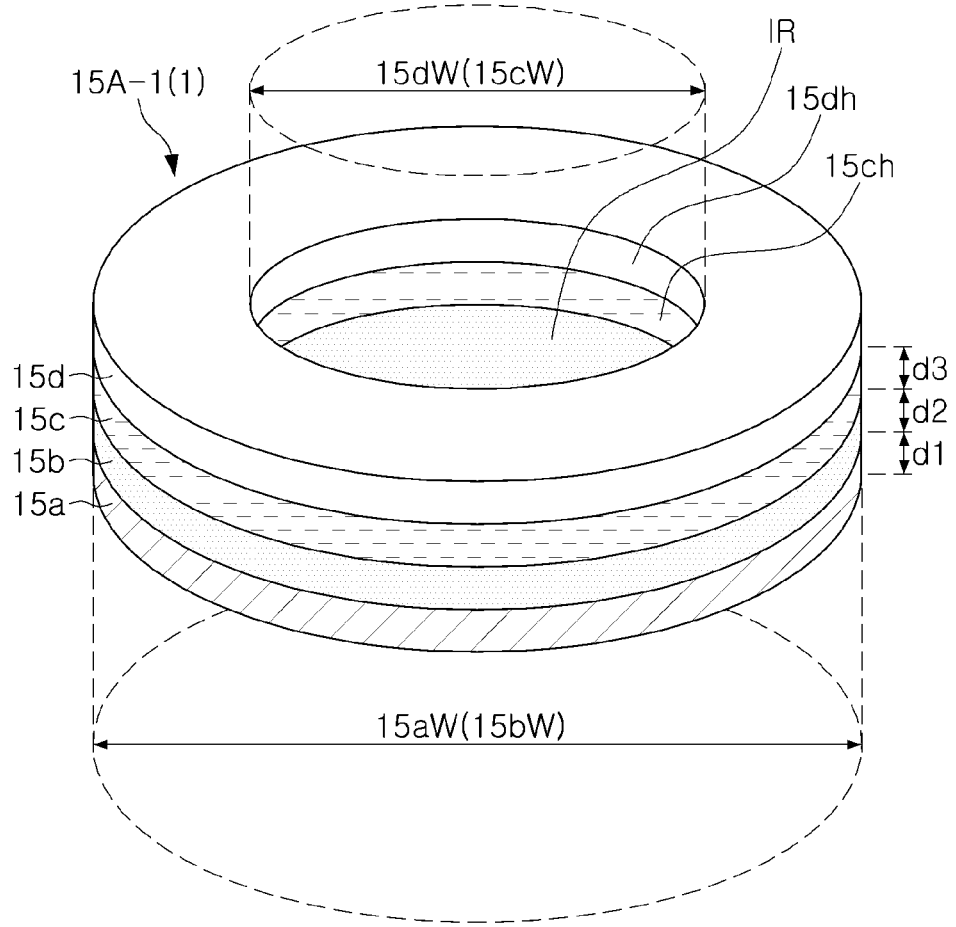
FIGS. 2B and 2C are perspective views of filter units according to example embodiments of the present disclosure.
Figure 2C:
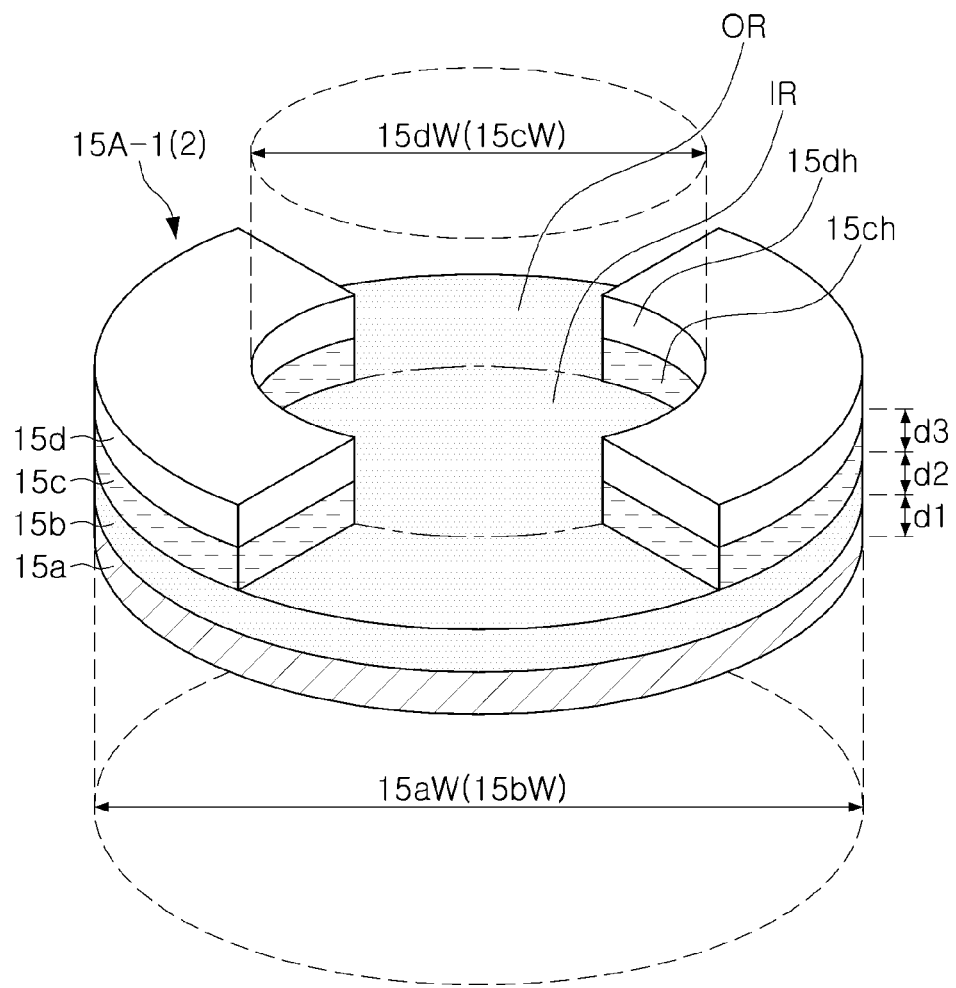
Figure 4:
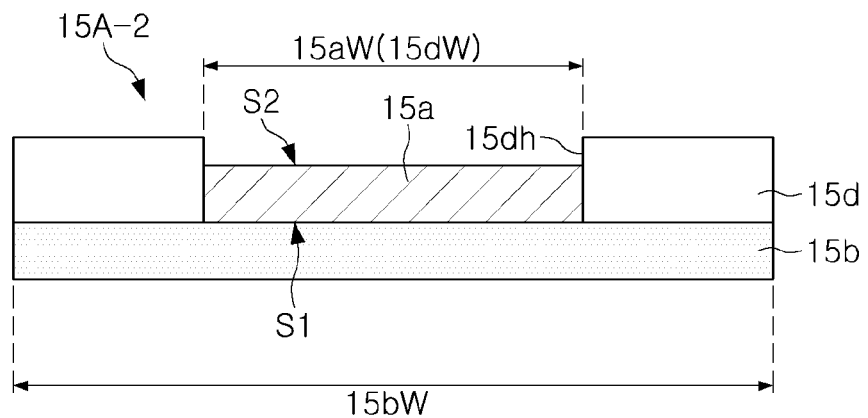
FIG. 4 is a vertical cross-sectional view illustrating an example of a filter unit in the apparatus for generating extreme ultraviolet light of FIG. 1.
Figure 5A:
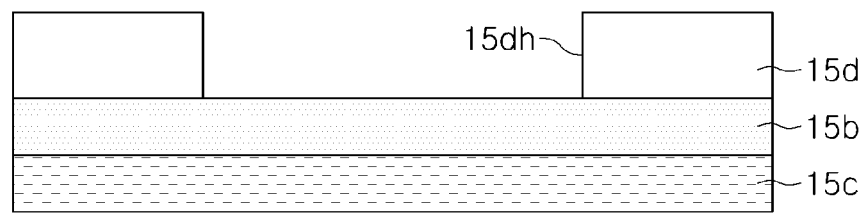
FIGS. 5A and 5B are schematic diagrams illustrating a method of manufacturing the filter unit of FIG. 4.
Figure 5B:
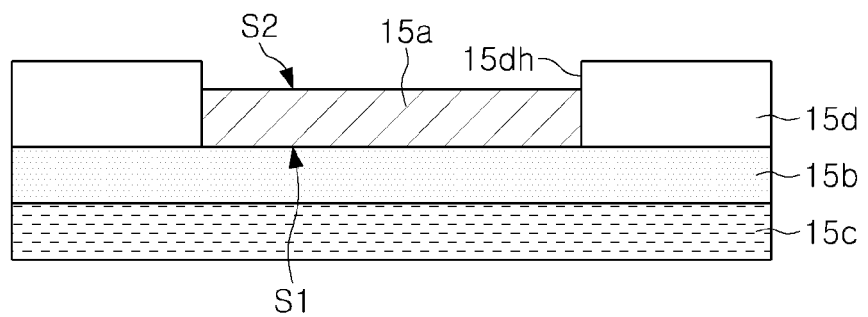

Hereinafter, structures of the filter units 15A-1 and 15A-2 according to an example embodiment of the present disclosure will be described in detail with reference to FIGS. 2A to 5B. FIG. 2A is a diagram illustrating an example of a vertical cross-section of a filter unit 15A-1 in the apparatus 10A for generating extreme ultraviolet light of FIG. 1, FIGS. 2B and 2C are perspective views of filter units 15A-1 according to example embodiments of the present disclosure, respectively, FIGS. 3A to 3D are schematic diagrams illustrating a method of manufacturing the filter unit 15A-1 of FIG. 2A. FIG. 4 is a diagram illustrating a vertical cross-section of a filter unit 15A-2 according to an example embodiment of the present disclosure in the apparatus for generating extreme ultraviolet light of FIG. 1, and FIGS. 5A and 5B are schematic diagrams illustrating a method of manufacturing the filter unit 15A-2 of FIG. 4.

Referring to FIG. 2A, the filter unit 15A-1 may include a filter 15a, a protective layer 15b, a polymer layer 15c, and a frame 15d that are sequentially stacked. In an example embodiment of the present disclosure, the frame 15d may be disposed on one surface of the protective layer 15b to face a front surface S1 of the filter 15a, and the filter unit 15A-1 may further include a polymer layer 15c, having a second exposure region 15ch exposing at least a portion of the protective layer 15b in correspondence to the exposure region 15dh, between the frame 15d and the protective layer 15b. The filter unit 15A-1 may be disposed toward the condensing unit 14A such that the light L1 of FIG. 1 is incident on one surface of the protective layer 15b exposed by the first and second exposure regions 15db and 15ch. The first and second exposure regions 15db and 15ch may each have, for example, an opening shape or a through-hole shape. The polymer layer 15c may be in the of a film including at least one of polydimethyl siloxane (PDMS) and polymethyl methacrylate (PMMA). A material of the frame 15d is not necessarily limited by any one composition, and may include, for example, a metallic or non-metallic material.

In an example embodiment of the present disclosure, the width 15dW of the first exposure region 15db in the direction, parallel to the front surface S1 of the filter 15a, may be smaller than the width 15bW of the protective layer 15b and the width 15aW of the filter 15a. The width 15bW of the protective layer 15b and the width 15aW of the filter 15a may be substantially the same. However, example embodiments of the present disclosure are not necessarily limited thereto, and the protective layer 15b and the filter 15a may have different widths. The width 15cW of the second exposure region 15ch of the polymer layer 15c may be substantially the same as the width 15dW of the first exposure region 15db, but example embodiments of the present disclosure are not necessarily limited thereto.

The filter 15a may have a predetermined thickness selected according to a desired filtering efficiency of the extreme ultraviolet light L2. For example, the thickness d1 of the filter 15a in a direction, perpendicular to the front surface S1 of the filter 15a, may be within the range of about 10 nm to about 500 nm, or the range of about 50 nm to about 200 nm. When a thickness d1 of the filter 15a is about 10 nm or less, the filtering effect of the extreme ultraviolet light L2 may be insignificant. When the thickness d1 of the filter 15a is about 500 nm or more, the loss of the extreme ultraviolet light L2 may be increased to deteriorate process efficiency. The protective layer 15b may have a predetermined thickness to effectively prevent contamination of the filter 15a. For example, the thickness d2 of the protective layer 15b may be within the range of about 0.1 nm to about 100 nm, the range of about 0.1 nm to about 50 nm, or the range of about 0.1 nm to about 30 nm. The polymer layer 15c may have a predetermined thickness to handle the protective layer 15b. For example, the thickness d3 of the polymer layer 15c may be within the range of about 100 nm to about 500 nm, or the range of about 200 nm or more. The thickness of the frame 15d is not necessarily limited to any one particular value, and may have a size sufficient to handle the protective layer 15b in a deposition process of the filter 15a. The thickness of the frame 15d may be adjusted in consideration of the thickness d3 of the polymer layer 15c.

Referring to FIGS. 2B and 2C, a frame 15d may have various shapes depending on a design thereof. For example, the frame 15d may have a shape continuously or discontinuously surrounding an internal IR of the first protective layer 15b exposed through the first exposure region 15dh. In an example embodiment of the present disclosure, a filter unit 15A-1(1) may include a disc-shaped filter 15a and a disc-shaped protective layer 15b, and a ring-shaped polymer layer 15c and a ring-shaped frame 15d extending along a periphery of the first protective layer 15b (see FIG. 2B). In this case, a first region 15dh of the frame 15d may be in the form of a through-hole penetrating through the frame 15d to expose the first protective layer 15b. In addition, in an example embodiment of the present disclosure, a filter unit 15A-1(1) may include a disc-shaped filter 15a and a disc-shaped protective layer 15b, and a polymer layer 15c and a frame 15d, respectively having a shape of one or more (for example, two) blocks disposed in an edge region of the first protective layer 15b to be spaced apart from each other (see FIG. 2C). In this case, a first region 15dh of the frame 15d may have a shape of an opening exposing an internal region IR of the first protective layer 15b surrounded by a peripheral region OR of the first protective layer 15b, The polymer layer 15c may have a shape similar to the shape of the frame 15d, so that the second region 15ch may be defined similarly to the first region 15dh.

Hereinafter, a method of manufacturing an apparatus for generating extreme ultraviolet light according to an example embodiment of the present disclosure will be described with reference to FIGS. 3A to 3D together with FIG. 2A.

Figure 3A:
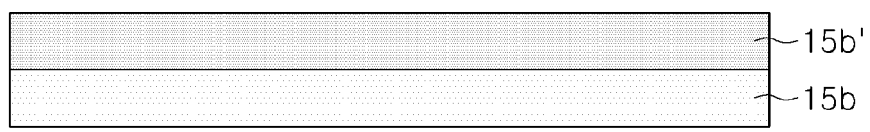
FIGS. 3A to 3D are schematic diagrams illustrating a method of manufacturing the filter unit of FIG. 2A.

Referring to FIG. 3A, a method of manufacturing an apparatus for generating extreme ultraviolet light may include forming a first protective layer 15b on a catalyst layer 15b' to prepare the first protective layer 15b. The catalyst layer 15b' may include a metal or non-metal material. For example, the catalyst layer 15b' may be a silicon carbide (SiC layer or a metal foil including copper (Cu) or nickel (Ni). The first protective layer 15b may be formed by an epitaxial growth, chemical vapor deposition (CVD), plasma enhanced chemical vapor deposition (ECVD), or sputtering process.

Figure 3B:
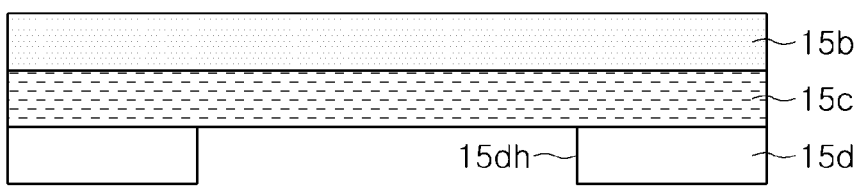

Referring to FIG. 3B, the method of manufacturing an apparatus for generating extreme ultraviolet light may include attaching a polymer layer 15c to a first protective layer 15b and attaching a frame 15d having an exposure region 15dh to the polymer layer 15c. The catalyst layer 15b' of FIG. 3A may be removed using an etching process, a heat dissipating tape, or the like, after attaching the polymer layer 15c. The polymer layer 15c may be coated on the first protective layer 15b. The frame 15d may be attached to the polymer layer 15c without an additional adhesive.

Figure 3C:
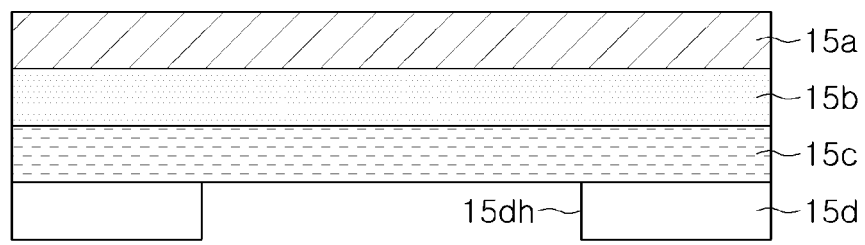

Referring to FIG. 3C, the method of manufacturing an apparatus for generating extreme ultraviolet light may include depositing a filter 15a on an upper surface, opposite to a lower surface on which the polymer layer 15c is formed, of the first protective layer 15b. The filter 15a may include, for example, zirconium and may be directly deposited on a surface of the first protective layer 15b by a sputtering process. Accordingly, a metal oxide layer a light not be formed between the first protective layer 15b and the filter 15a.

Figure 3D:
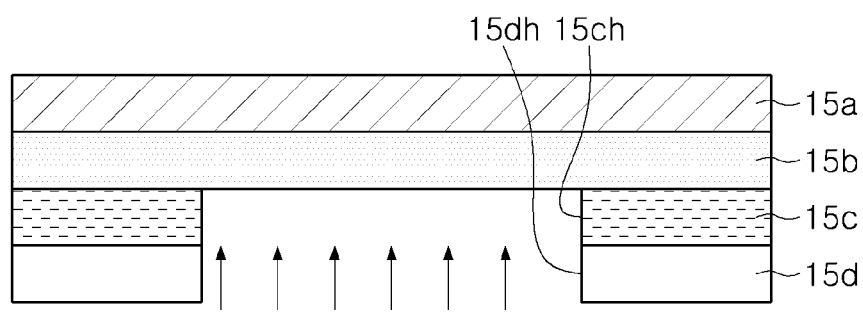

Referring to FIG. 3D, the method of manufacturing an apparatus for generating extreme ultraviolet light may include removing a portion of the polymer layer 15c in correspondence to the first exposure region 15dh of the frame 15d to expose a portion of the first protective layer 15b. Accordingly, the polymer layer 15c may have a second exposure region 15ch, corresponding to the first exposure region 15d, such that light is incident on a front surface of the filter 15A.

Referring to FIG. 4, a filter unit 15A-2 may include a filter 15a, a protective layer 15b, and a frame 15d. In an example embodiment of the present disclosure, the frame 15d may be disposed on one surface of the protective layer 15b to at least partially surround a side surface of the filter 15a, and the filter 15a may be disposed in an exposure region 15dh of the frame 15d. When the frame 15d has the form illustrated in FIG. 2C, the filter 15a may be disposed in an internal region IR of the first protective layer 15b and a portion of a periphery region OR in which the frame 15d is not disposed. The frame 15d may be in direct contact with one surface of the protective layer 15b, and a metal oxide layer might not be present between a front surface S1 of the filter 15a and the protective layer 15b.

Hereinafter, a method of manufacturing an apparatus for generating extreme ultraviolet light according to an example embodiment of the present disclosure will be described with reference to FIGS. 5A and 5B together with FIG. 4.

Referring to FIG. 5A, in a method of manufacturing an apparatus for manufacturing extreme ultraviolet light according to an example embodiment of the present disclosure, a frame 15d may be attached to an upper surface of a first protective layer 15b on which a polymer layer 15c is not disposed, unlike FIG. 3B. In an example embodiment of the present disclosure, the frame 15d may be attached to a surface on which a catalyst layer 15b' of FIG. 3A is removed. The frame 15d may be attached to the polymer layer 15c without an additional adhesive. The first exposure region 15db may directly expose a portion of the first protective layer 15b.

Referring to FIG. 5B, the method of manufacturing an apparatus for manufacturing extreme ultraviolet light according to an example embodiment of the present disclosure may include removing the polymer layer 15c disposed on a lower surface of the first protective layer 15b. In an example embodiment of the present disclosure, the filter 15a may be deposited within the first exposure region 15dh to be in, contact with upper surface of the first protective layer 15b. The filter 15a may be deposited on the upper surface of the first protective layer 15b by a sputtering process.

Figure 6:
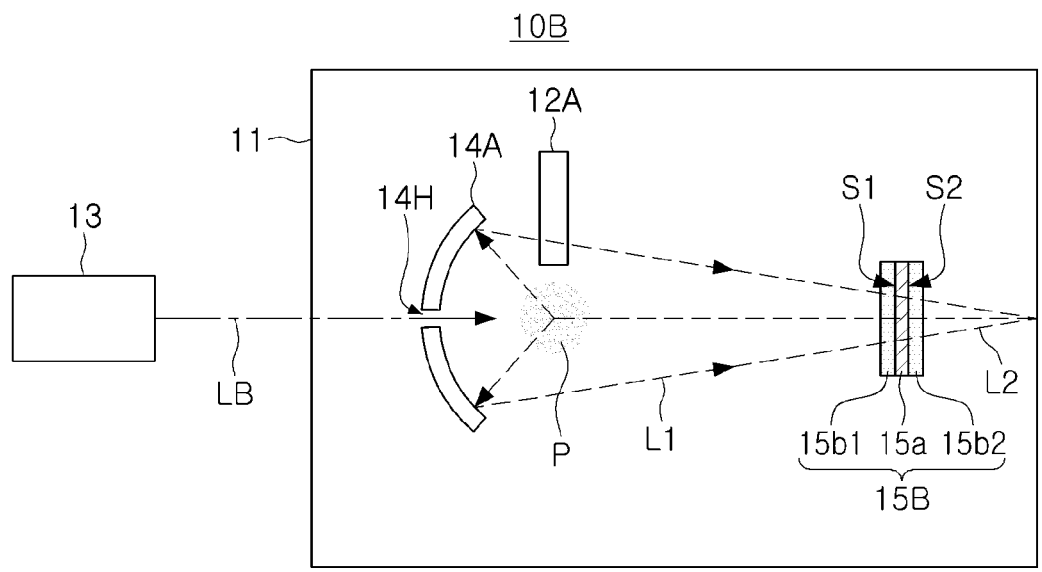
FIG. 6 is a schematic diagram illustrating an apparatus for generating extreme ultraviolet light according to an example embodiment of the present disclosure.
Figure 7:
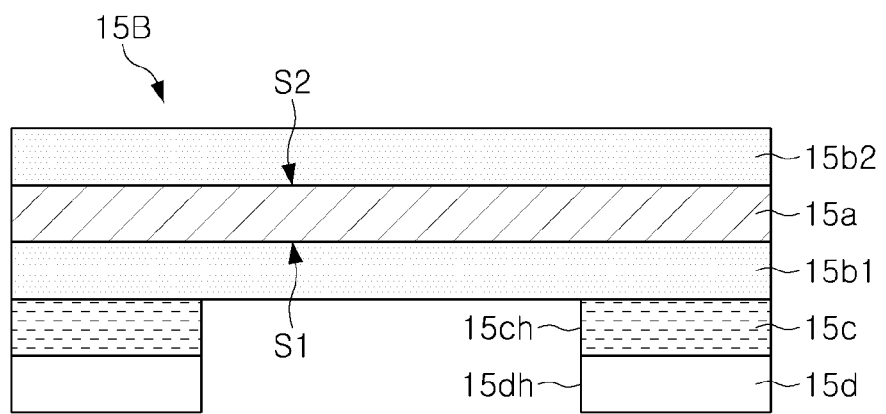
FIG. 7 is a vertical cross-sectional view illustrating an example of a filter unit in the apparatus for generating extreme ultraviolet light of FIG. 6.

FIG. 6 is a schematic diagram illustrating an apparatus 10B for generating extreme ultraviolet light according to an example embodiment of the present disclosure, and FIG. 7 is a diagram illustrating a vertical cross-section of a filter unit 15B according to an example embodiment of the present disclosure in the apparatus 10B for generating extreme ultraviolet light of FIG. 6.

Referring to FIGS. 6 and 7, the filter unit 15B of the apparatus 10B for generating extreme ultraviolet light may include first and second protective layer 15b1 and 15b2, respectively disposed on both surfaces S1 and S2 of the filter 15a. In an example embodiment of the present disclosure, the filter 15a may have a front surface S1 in contact with a first protective layer 15b1 and a rear surface S2 disposed opposite to the front surface S1, and the method of manufacturing the apparatus 10B for generating extreme ultraviolet light may further include transferring a second protective layer 15b2 to the rear surface S2 of the filter 15a. Therefore, the first protective layer 15b1 may be disposed on the front surface S1 of the filter 15a, and the second protective layer 15b2 may be disposed on the rear surface S2 of the filter 15a. Since extreme ultraviolet light is incident on the front surface S1 of the filter 15a to pass through the rear surface S2, the second protective layer 15b2 may be further disposed on the rear surface S2 of the filter 15b to effectively extend a filter replacement period. The second protective layer 15b2 may be transferred to the rear surface S2 of the filter 15a without forming a metal oxide layer by a transfer process using an additional polymer layer. Since the second protective layer 15b2 has substantially the same (or similar) technical characteristics as the first protective layer 15b1, a description of contents overlapping those described above will be omitted.

Figure 8:
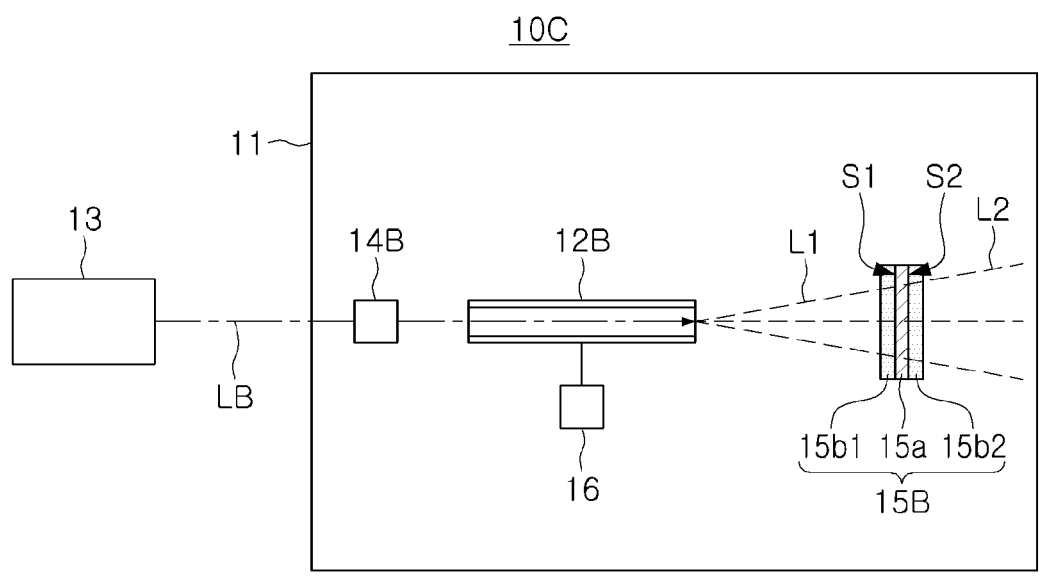
FIG. 8 is a schematic diagram illustrating an apparatus for generating extreme ultraviolet light according to an example embodiment of the present disclosure.

FIG. 8 is a schematic diagram illustrating an apparatus 10C for generating extreme ultraviolet light according to an example embodiment of the present disclosure.

Referring to FIG. 8, the apparatus 10C for generating extreme ultraviolet light may include a chamber 11, a raw material supply unit 12B, extreme ultraviolet light source unit 13, a condensing unit (hereinafter a laser beam condenser) 14B, and a filter unit 15B. Since the chamber 11, the extreme ultraviolet light source unit 13, and the filter unit 15B having the same (or similar) characteristics as those in the above-described embodiments, a description of contents overlapping those described above will be omitted. The filter unit 15B of FIG. 8 is illustrated as having the form according to the embodiment of FIG. 6, but the filer unit 15B of FIG. 8 may be replaced with the filter unit 15A of FIG. 1.

In an example embodiment of the present disclosure, the raw material supply unit 12B may include a gas cell having an inside filled with inert gas. The inert gas may include, for example, helium ($H_2$), neon (Ne), argon (Ar), or Xeon (Xe). The extreme ultraviolet light source unit 13 may include a femtosecond laser. A laser LB, supplied to the raw material supply unit 12B by the extreme ultraviolet light source unit 13, and an inert gas or a mixed gas in the raw material supply unit 12B may interact each other to generate a high-order harmonic wave. A laser of the extreme ultraviolet light source unit 13 may be supplied to the raw material supply unit 12B through a laser beam condenser 14B. In addition, the apparatus 10C for generating extreme ultraviolet light may further include a gas pressure regulator 16 for adjusting a pressure in the raw material supply unit 12B. In FIG. 8, the apparatus 10C for generating extreme ultraviolet light is illustrated in brief, but may have various forms and configurations capable of generating a high-order harmonic wave.

Figure 9:
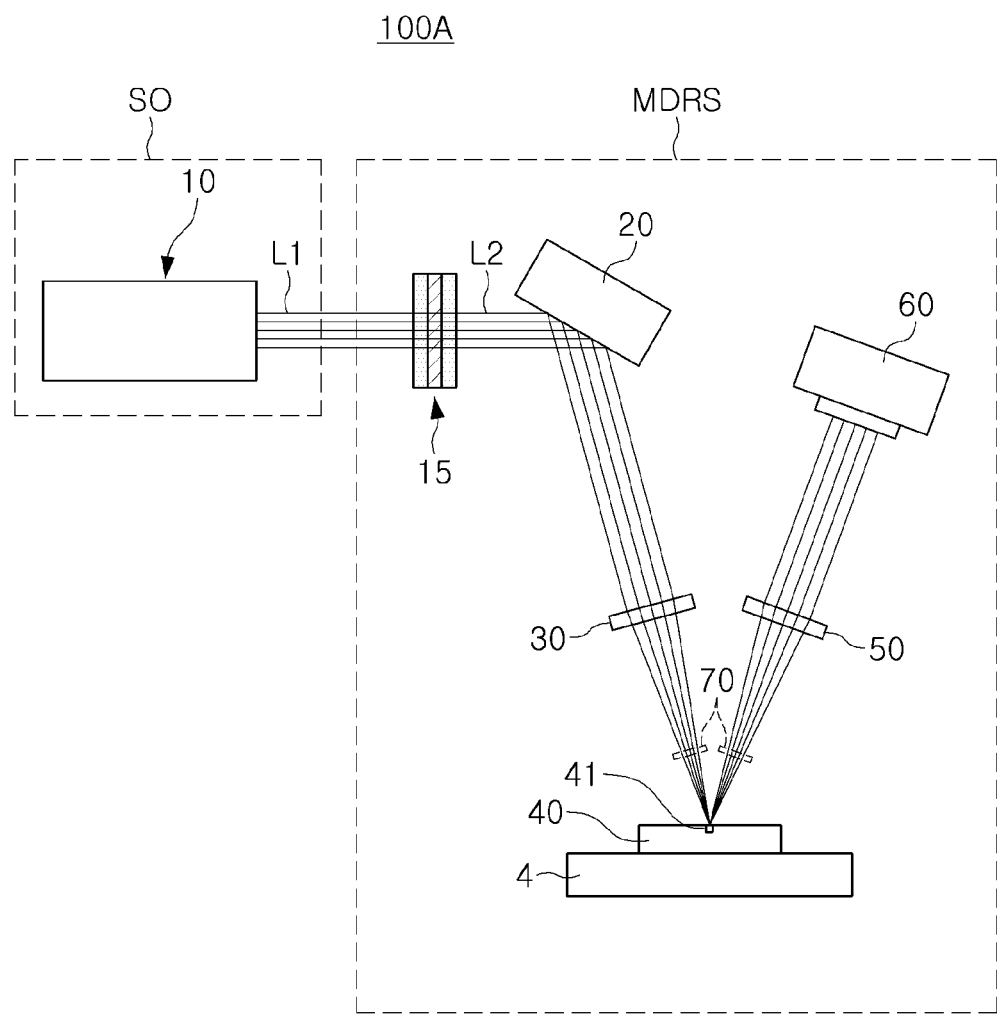
FIG. 9 is a schematic diagram illustrating an extreme ultraviolet light system according to an example embodiment of the present disclosure.

FIG. 9 is a schematic diagram illustrating an extreme ultraviolet (EUV) light system 100A and mask inspection apparatus according to an example embodiment of the present disclosure.

Referring to FIG. 9, the EUV system 100A may include extreme ultraviolet light source system (referred to as a "light source system") SO and a mask inspection system MDRS. The light source system SO may include a light generation unit 10 generating first light L1. In FIG. 9, a filter unit 15 disposed in the mask inspection system MDRS may be disposed in the light source system SO or in the light generating unit 10. The filter unit 15 may have at least one structure, among the structures illustrated in FIGS. 2A, to 2C, 4, and 6. The filter unit 15 may filter the first light L1 to extract extreme ultraviolet light L2 therefrom. The extreme ultraviolet light L2 may have a wavelength ranging from about 4 nm to about 124 nm, a wavelength ranging from about 4 nm to about 20 nm, or a wavelength of about 13.5 nm. The light generation unit 10 may have the same (or similar) structure and function as the apparatus for generating extreme ultraviolet light described above in FIGS. 1 to 8.

The mask inspection system MDRS may include a mirror unit 20, a zone plate lens 30, a photomask 40, and a detection unit 60. The mirror unit 20 may include at least one mirror reflecting the extreme ultraviolet light L2 toward the photomask 40. The mirror may select and reflect light having a wavelength of about 12 nm to 14 nm. The mirror may have a single-layer structure or a multilayer structure including at least one of, for example, a molybdenum layer and a silicon layer. The mirror unit 20 may include a plurality of mirrors but, for brevity and ease of description of the drawings, only one mirror is illustrated in FIG. 9 (hereinafter, a reference numeral "20" may refer to a mirror). The zone plate lens 30 may be disposed between the mirror unit 20 and the photomask 40, may have a front surface, to which the extreme ultraviolet light L2 is incident, and a rear surface disposed opposite to the front surface, and may condense the extreme ultraviolet light L2 on one region 41 of the photomask 40. The zone plate lens 30 may have, for example, a shape in which a plurality of ring-shaped openings having different diameters are formed on a plate such as a silicon wafer, or the like. The photomask 40 may be a reflective mask including a reflective material and having a surface on which a microcircuit pattern of about 45 nm or less is formed. The photomask 40 may be disposed on a moving unit 4, and the moving unit 4 may move the photo mask 40 so that the detection unit 60 may scan an entire photomask 40. The moving unit 4 may be, for example, a stage. The detection unit 60 may detect extreme ultraviolet light reflected from the one region 41 of the photomask 40. The detection unit 60 may sense energy of the reflected extreme ultraviolet light and may transmit the sensed energy to an operation unit, and the operation unit may output a spatial image of the photomask 40.

In addition, the mask inspection system MDRS may further include an aperture 50 disposed between the photomask 40 and the detection unit 60 and having at least e through-hole through which the reflected extreme ultraviolet light passes. The aperture 50 may be formed on the same plate as the zone plate lens 30. The mask inspection system MDRS may further include an ordering storing aperture lens 70 disposed between the zone plate lens 30 and the photomask 40 and/or between the detection unit 60 and the photomask 40 and having at least one pinhole. The OSA lens 70 may block zero-order light and high-order light in addition to first-order light.

Figure 10:
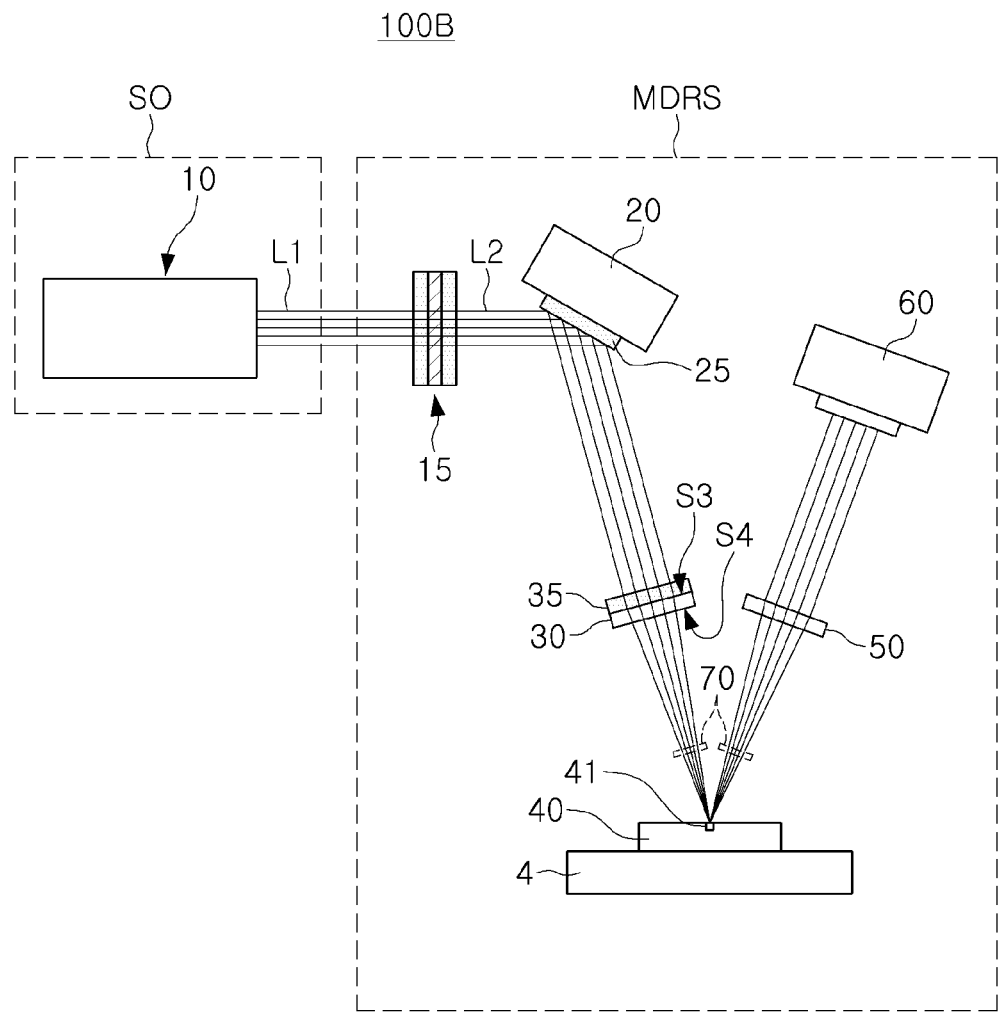
FIG. 10 is a schematic diagram illustrating an extreme ultraviolet light system according to an example embodiment of the present disclosure.
Figure 11A:
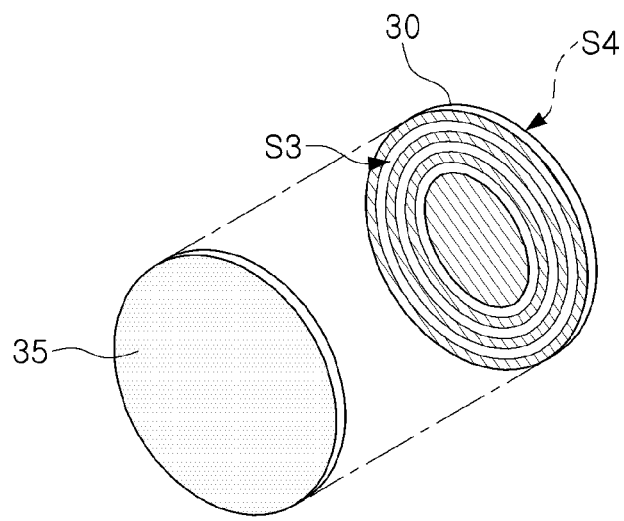
FIGS. 11A and 11B are diagrams illustrating an example of a zone plate lens in the extreme ultraviolet light system of FIG. 10.
Figure 11B:
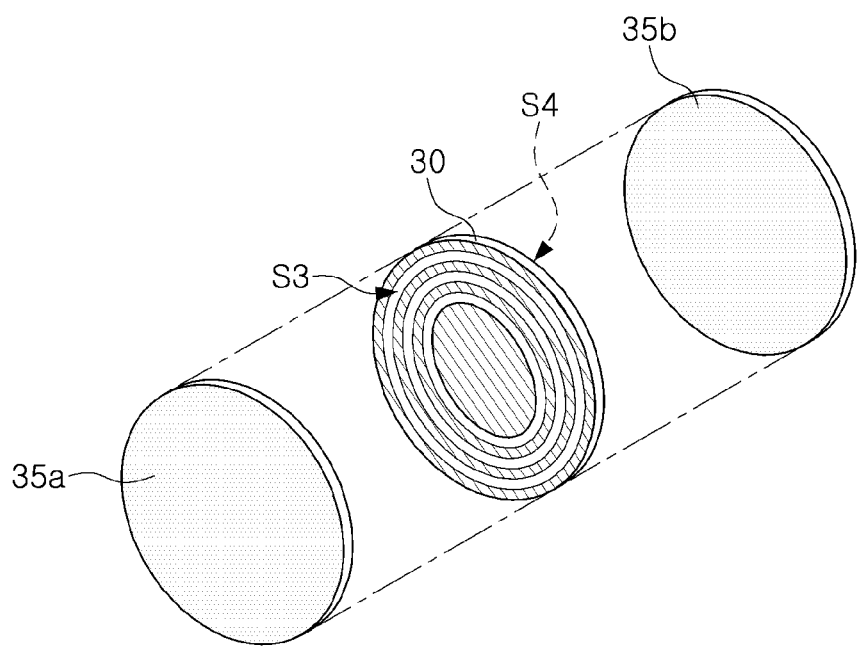

FIG. 10 is a schematic diagram illustrating an extreme ultraviolet light system 1008 according to an example embodiment of the present disclosure. FIG. 10 is a schematic view illustrating an extreme ultraviolet light mask inspection apparatus according to an example embodiment of the present disclosure. FIGS. 11A and 11B are diagrams illustrating a zone plate lens 300 according to an example embodiment of the present disclosure in the extreme ultraviolet light system 100B of FIG. 10, and FIG. 12 is a diagram illustrating a mirror unit 20 according to an example embodiment of the present disclosure in the extreme ultraviolet light system 100B of FIG. 10.

Referring to FIG. 10, the extreme ultraviolet light system 1008 may further include a lens protective layer 35 disposed on at least one of a front surface S3 and a rear surface S4 of the zone plate lens 30. In addition, the mirror unit 20 may further include a mirror protective layer 25 disposed on a front surface of a mirror on which the extreme ultraviolet light L2 is reflected. Features of the other components in the light source system SO and the mask inspection system MDRS, other than the zone plate lens 30 and the mirror unit 20, are identical or similar to those described in FIG. 9, and thus, detailed descriptions thereof will be omitted. Hereinafter, structures of the zone plate lens 30 and the mirror unit 20 will be described in detail with reference to FIGS. 11A, 11B, and 12.

Referring to FIGS. 11A and 11B, as an example, a lens protective layer 35 may be attached to the front surface S3 of a zone plate lens 30 (see FIG. 11A). The lens protective layer 35 may have the same (or similar) characteristics as a protective layer of a filter unit 15, and may include, for example, at least one of a film including graphite and graphene. The lens protective layer 35 nm prevent the zone plate lens 30 from being deteriorated and oxidized by the extreme ultraviolet light L2 to extend a replacement period of components and to increase process efficiency. As an example, a pair of lens protective layers 35a and 35b may be attached to a front surface S3 and a rear surface S4 of a zone plate lens 30, respectively (see FIG. 11B). In the zone plate lens 30, similarly to the filter unit 15, since extreme ultraviolet light L2 incident on the front surface S3 passes through the rear surface S4, the lens protective layer 35b may also be disposed on the rear surface S4 to effectively protect the zone plate lens 30.

Figure 12:
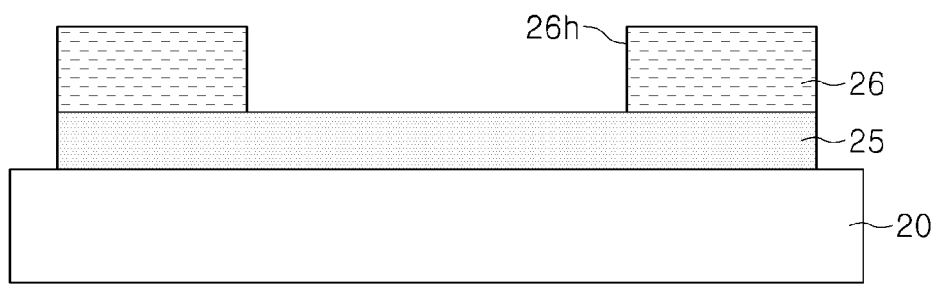
FIG. 12 is a diagram illustrating an example of a mirror unit in the extreme ultraviolet light system of FIG. 10.

Referring to FIG. 12, as an example, a mirror protective layer 25 may be attached to a front surface of a mirror. The mirror protective layer 25 may have the same (or similar) characteristics as a protective layer and a lens protective layer 35 of a filter unit 15. The mirror protective layer 25 may protect the mirror from extreme ultraviolet light L2 to prevent deterioration, oxidation, and the like, of the mirror and to extend a replacement period of the mirror or the mirror unit 20. In addition, as an example, a polymer layer 26 having an exposure region 26h, exposing at least a portion of the mirror protective layer 25, may be further provided on the mirror protective layer 25. The polymer layer 26 may be a PDMS or PMMA layer attached during a process of transferring the mirror protective layer 25 on the mirror. A portion of the polymer layer 26 may be removed to form an exposure region 26h securing an incident surface of extreme ultraviolet light L2.

Figure 13:
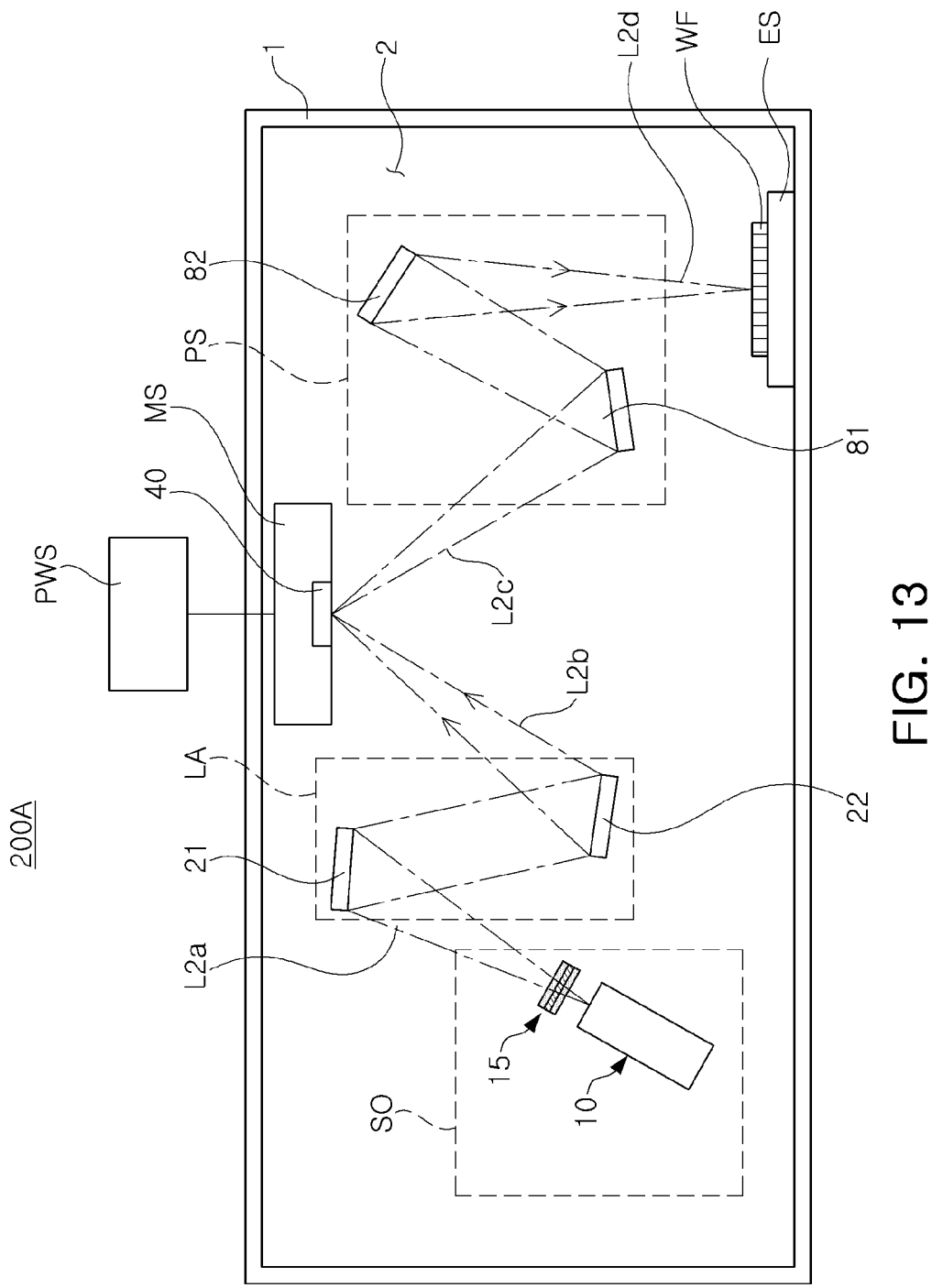
FIG. 13 is a schematic diagram illustrating an extreme ultraviolet light system according to an example embodiment of the present disclosure.

FIG. 13 is a schematic diagram illustrating an extreme ultraviolet light system 200A having an exposure apparatus according to an example embodiment of the present disclosure.

Referring to FIG. 13, the extreme ultraviolet light system 200A may include a light source system SO, a luminance system LA, and a projection system PS. In addition, the extreme ultraviolet light system 200A may include an exposure chamber 1 in which the light source system SO, the luminance system LA, and the projection system PS are disposed, a mask stage MS in which a photomask 40 is mounted, and a wafer stage ES on which the semiconductor wafer WE is mounted.

The exposure chamber 1 may have an internal space 2, and the extreme ultraviolet light source system SO, the luminance system LA, the projection system PS, the mask stage MS, and the wafer stage ES may each be disposed in the internal space 2. As an example, some components may be disposed outside of the exposure chamber 1. For example, a portion of the light source system SO may be disposed outside of the exposure chamber 1. The internal space 2 of the exposure chamber 1 may be in a low pressure state of about 5 Pa or less, or a vacuum state to prevent first extreme ultraviolet light L2a, generated from the light source system SO, from being absorbed by atmosphere.

The mask stage MS may allow a photomask 40 to be fixed by electrostatic force generated by power applied from a power supply unit PWS. The wafer stage ES may move a semiconductor wafer WF to change an exposure region of the semiconductor wafer WF. The semiconductor wafer WF may be loaded/unloaded to/from the wafer stage ES.

The light source system SO may generate first extreme ultraviolet light L2a. A filter unit 15 may be disposed in the light source system SO or in the light generation unit 10. The filter unit 15 may have at least one of the structures illustrated in FIGS. 2A to 2C, 4, and 6. The filter unit 15 may filter light, generated by the light generation unit 10, to extract the first extreme ultraviolet light L2a. The first extreme ultraviolet light L2a may have a wavelength ranging from about 4 nm to about 124 nm, a wavelength ranging from about 4 nm to about 20 nm, or a wavelength of about 13.5 nm. The light generation unit 10 may have the same (or similar) structure and function as the apparatus for generating extreme ultraviolet light described above in FIGS. 1 to 8. For example, in a chamber of the light source system SO, a laser supplied by the extreme ultraviolet light source unit (13 of FIG. 1) and a droplet supplied by the raw material supply unit (12A of FIG. 1) may collide on the order of 50,000 times per second to generate plasma. The condensing unit (14A of FIG. 1) may condense portions of extreme ultraviolet light, emitted from the plasma in all directions, and to provide the condensed extreme ultraviolet light to the luminance system LA.

The luminance system LA may include a plurality of mirrors 21 and 22 to direct extreme ultraviolet light to a surface of the photomask 40. For example, the plurality of mirrors 21 and 22 may reflect the first extreme ultraviolet light L2a, emitted from the light source system SO, to pass through the luminance system LA, and may direct second extreme ultraviolet light L2b, passing through the luminance system LA, to the surface of the photomask 40 of the mask stage MS. Among the plurality of mirrors included in the luminance system LA, only two mirrors 21 and 22 are illustrated for brevity of the drawing and ease of description but it is to be understood that additional mirrors may be used.

The projection system PS may include a plurality of mirrors 81 and 82 to direct extreme ultraviolet light L2c, reflected by the photomask 40, to a surface of the semiconductor wafer WF. For example, the plurality of mirrors 81 and 82 may reflect the third extreme ultraviolet light L2c, reflected from the photomask 40, to pass through the projection system PS, and the fourth extreme ultraviolet light L2d passing through the projection system. PS may be directed to a surface of the semiconductor wafer WF on the wafer stage ES. The fourth extreme ultraviolet light L2d may expose a photoresist layer on the surface of the semiconductor wafer WF. Among the plurality of mirrors included in the projection system PS, only two mirrors 81 and 82 are illustrated for brevity of the drawing and ease of description but it is to be understood that additional mirrors may be used.

Figure 14:
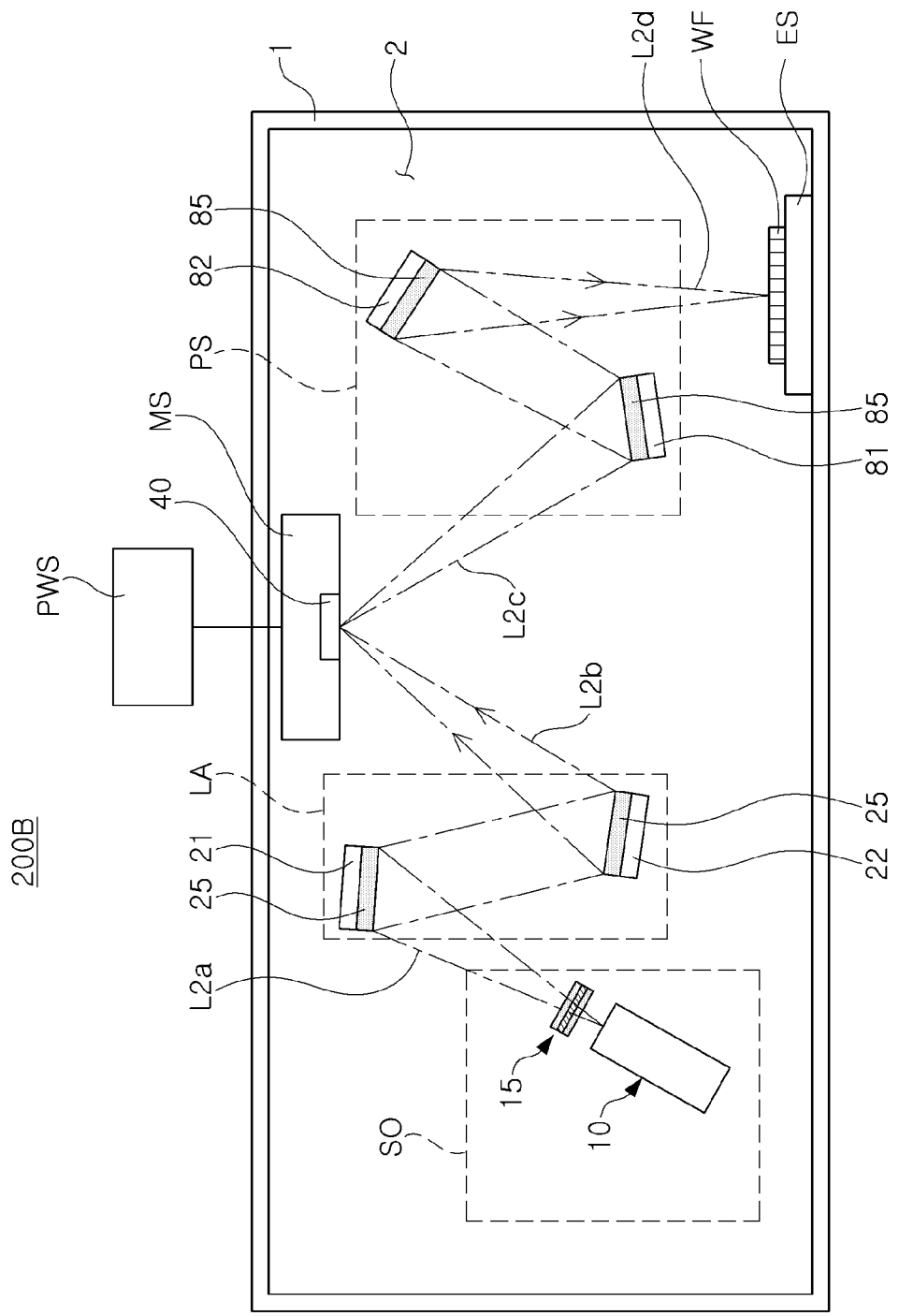
FIG. 14 is a schematic diagram illustrating an extreme ultraviolet light system according to an example embodiment of the present disclosure.

FIG. 14 is a schematic diagram of an extreme ultraviolet light system 200B having an exposure apparatus according to are example embodiment of the present disclosure.

Referring to FIG. 14, the extreme ultraviolet light system 200B may further include mirror protective layers 25 and 85 protecting mirrors 21, 22, 81, and 82 of each of a luminance system LA and a projection system PS. For example, each of the luminance system LA and the projection system PS may include a plurality of mirrors 21, 22, 81, and 82, reflecting first extreme ultraviolet light L2a or third extreme ultraviolet light L2c, and a plurality of mirror protective layers 25 and 85 respectively disposed on front surfaces of the plurality of mirrors 21, 22, 81, and 82. Since the plurality of mirrors 21, 22, 81, and 82 reflect the extreme ultraviolet light incident on front surfaces thereof, unlike the filter unit 15, contamination of a mirror may be effectively prevented by the mirror protective layers 25 and 85 disposed only on an incident surface of the extreme ultraviolet light.

In the above example embodiments of the present disclosure, an extreme ultraviolet light mask inspection apparatus and an extreme ultraviolet light exposure apparatus have been described as an extreme ultraviolet light system but the extreme ultraviolet light system according to the present disclosure is not necessarily limited thereto and may be applied to various semiconductor manufacturing apparatuses.

As described above, an apparatus for generating extreme ultraviolet in which a filter unit including a protective layer is introduced to increase extreme ultraviolet light process efficiency and to reduce downtime and maintenance costs, a method of manufacturing the same, and an extreme ultraviolet system light may be provided.

While example embodiments of the present disclosure have been shown and described above, it will be apparent to those skilled in the art that modifications and variations could be made without departing from the scope of the present inventive concept as set forth herein.

What is claimed is:

1. An apparatus for generating extreme ultraviolet light, the apparatus comprising:
   a raw material supply unit configured to supply a plasma source for generating extreme ultraviolet (EUV) light;
   an extreme ultraviolet light source unit configured to supply a laser beam to generate plasma from the plasma source;
   a filter having a front surface, on which light generated from the plasma is incident, and a rear surface, disposed opposite to the front surface, and configured to extract extreme ultraviolet light from the light;
   a first protective layer disposed on the front surface of the filter; and
   a frame having a first region exposing at least a portion of the filter or the first protective layer and disposed on the first protective layer,
   wherein a width of the first region, in a direction parallel to the front surface of the filter, is smaller than a width of the first protective layer, in the direction parallel to the front surface of the filter, and smaller than or equal to a width of the filter in the direction parallel to the from surface of the filter.

2. The apparatus of claim 1, wherein the first protective layer is in direct contact with the front surface of the filter.

3. The apparatus of claim 1, wherein the filter includes a metal, and
   a metal oxide layer is not present between the front surface of the filter and the first protective layer.

4. The apparatus of claim 1, wherein the first protective layer has a thickness ranging from about 0.1 nm to about 100 am.

5. The apparatus of claim 1, further comprising:
   a polymer layer disposed between the first protective layer and the frame and having a second region exposing at least a portion of the first protective layer in correspondence to the first region,
   wherein the frame faces the front surface of the filter.

6. The apparatus of claim 5, wherein the polymer layer includes polydimethylsiloxane (PDMS) and/or polymethyl methacrylate (PMMA).

7. The apparatus of claim 5, wherein the polymer layer has a thickness ranging from about 100 nm to about 500 nm.

8. The apparatus of claim 5, further comprising:
   a second protective layer disposed on the rear surface of the filter.

9. The apparatus of claim 1, wherein the filter is disposed in the first region, and
the frame at least partially surrounds a side surface of the filter.

10. An extreme ultraviolet (EUV) light system, comprising:
a filter unit including a filter having a front surface, on which light is incident, and a rear surface, disposed opposite to the front surface, and configured to extract EUV light from the light, the filter having a protective layer disposed on the front surface thereof, a polymer layer, and a frame exposing at least a portion of the protective layer and stacked sequentially on the protective layer, the filter unit being disposed on a path along which the light travels; and
a mirror unit including at least one mirror reflecting the EUV light toward a photomask.

11. The EUV light system of claim 10, further comprising:
a detection unit configured to detect EUV light reflected from the photomask.

12. The EUV light system of claim 11, further comprising:
an aperture disposed between the photomask and the detection unit and having at least one through-hole through which the reflected EUV light passes.

13. The EUV light system of claim 10, further comprising:
a zone plate lens disposed between the mirror unit and the photomask, having a front surface, on which the EUV light is incident, and a rear surface disposed opposite to the front surface, and configured to condense the EUV light on the photomask; and
a lens protective layer disposed on at least one of the front surface and the rear surface of the zone plate lens.

14. The EUV light system of claim 13, further comprising:
an order sorting aperture (OSA) lens disposed between the zone plate lens and the photomask and having at least one pinhole.

15. The EUV light system of claim 10, wherein the mirror has a front surface on which the EUV light is incident, and wherein the EUV system further comprises a mirror protective layer disposed on the front surface of the mirror.

16. The EUV light system of claim 15, further comprising:
a polymer layer disposed on the mirror protective layer and exposing at least a portion of the mirror protective layer.

17. The EUV light system of claim 10, further comprising:
a light generation unit including an EUV light source unit, configured to generate a laser beam, and a gas cell having an inside filled with inert gas and configured to generate the light, including EUV, from the laser beam.

18. The BUY light system of claim 10, wherein the EUV light has a wavelength ranging from about 4 nm to about 124 nm.

19. An extreme ultraviolet (EUV) light system, comprising:
an EUV light source system configured to generate EUV light;
a luminance system configured to direct the EUV light to a surface of a photomask; and
a projection system configured to direct EUV light, reflected by the photomask, to a surface of a semiconductor wafer,
wherein the EUV light source system includes a filter unit including a filter configured to extract the BUY light from a light source, a protective layer disposed on a front surface of the filter, and a frame disposed on the protective layer and exposing at least a portion of the filter or the protective layer,
wherein the filter includes a metal, and the protective layer including graphite and/dr graphene, and
wherein a metal oxide layer is not present between the filter and the protective layer.

20. The EUV light system of claim 19, wherein each of the luminance system and the projection system includes a plurality of mirrors, reflecting the EUV light, and a plurality of mirror protective layers, respectively disposed on front surfaces of the plurality of mirrors.

* * * * *